United States Patent
Yamazaki et al.

(10) Patent No.: US 9,666,621 B2
(45) Date of Patent: *May 30, 2017

(54) SOLID-STATE IMAGING DEVICE

(71) Applicant: CANON KABUSHIKI KAISHA, Tokyo (JP)

(72) Inventors: Kazuo Yamazaki, Yokohama (JP); Tetsuya Itano, Sagamihara (JP); Nobuyuki Endo, Fujisawa (JP); Kyouhei Watanabe, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/592,783

(22) Filed: Jan. 8, 2015

(65) Prior Publication Data

US 2015/0115136 A1    Apr. 30, 2015

Related U.S. Application Data

(63) Continuation of application No. 13/823,057, filed as application No. PCT/JP2011/005269 on Sep. 20, 2011, now Pat. No. 8,963,271.

(30) Foreign Application Priority Data

Sep. 30, 2010 (JP) ................................. 2010-222590

(51) Int. Cl.
*H01L 27/146* (2006.01)
*H04N 5/235* (2006.01)
(Continued)

(52) U.S. Cl.
CPC .... *H01L 27/14623* (2013.01); *H01L 27/1464* (2013.01); *H01L 27/14607* (2013.01);
(Continued)

(58) Field of Classification Search
CPC ......... H01L 27/14623; H01L 27/14641; H01L 27/1464; H01L 27/14607; H01L 27/14643;
(Continued)

(56) References Cited

U.S. PATENT DOCUMENTS

| | | | |
|---|---|---|---|
| 7,714,904 B2 | 5/2010 | Kudoh | |
| 8,963,271 B2 * | 2/2015 | Yamazaki | ......... H01L 27/14607 257/290 |
| 2007/0069258 A1 | 3/2007 | Ahn | |

FOREIGN PATENT DOCUMENTS

| | | | |
|---|---|---|---|
| EP | 2230690 A2 | 9/2010 | |
| EP | 2230691 A2 | 9/2010 | |

(Continued)

*Primary Examiner* — Marcos D Pizarro Crespo
*Assistant Examiner* — Nelson Garces
(74) *Attorney, Agent, or Firm* — Canon USA, Inc. IP Division

(57) ABSTRACT

In a solid-state imaging device, a photoelectric conversion unit, a transfer transistor, and at least a part of electric charge holding unit, among pixel constituent elements, are disposed on a first semiconductor substrate. An amplifying transistor, a signal processing circuit other than a reset transistor, and a plurality of common output lines, to which signals are read out from a plurality of pixels, are disposed on a second semiconductor substrate.

25 Claims, 12 Drawing Sheets

(51) Int. Cl.
  *H04N 5/355* (2011.01)
  *H04N 5/3745* (2011.01)
  *H04N 5/378* (2011.01)

(52) U.S. Cl.
  CPC .. *H01L 27/14634* (2013.01); *H01L 27/14641* (2013.01); *H04N 5/3559* (2013.01); *H04N 5/378* (2013.01); *H04N 5/37452* (2013.01); *H01L 27/14643* (2013.01)

(58) Field of Classification Search
  CPC  H01L 27/14634; H04N 5/378; H04N 5/3559; H04N 5/37452
  USPC .................................................. 257/430–440
  See application file for complete search history.

(56) References Cited

FOREIGN PATENT DOCUMENTS

| | | |
|---|---|---|
| JP | 2003-168794 A | 6/2003 |
| JP | 2005-328493 A | 11/2005 |
| JP | 2006-041866 A | 2/2006 |
| JP | 2006-120921 A | 5/2006 |
| JP | 2008-235478 A | 10/2008 |
| JP | 2009-047658 A | 3/2009 |
| JP | 2009-170448 A | 7/2009 |
| JP | 2010-530633 A | 9/2010 |
| WO | 2009/123693 A1 | 10/2009 |

* cited by examiner

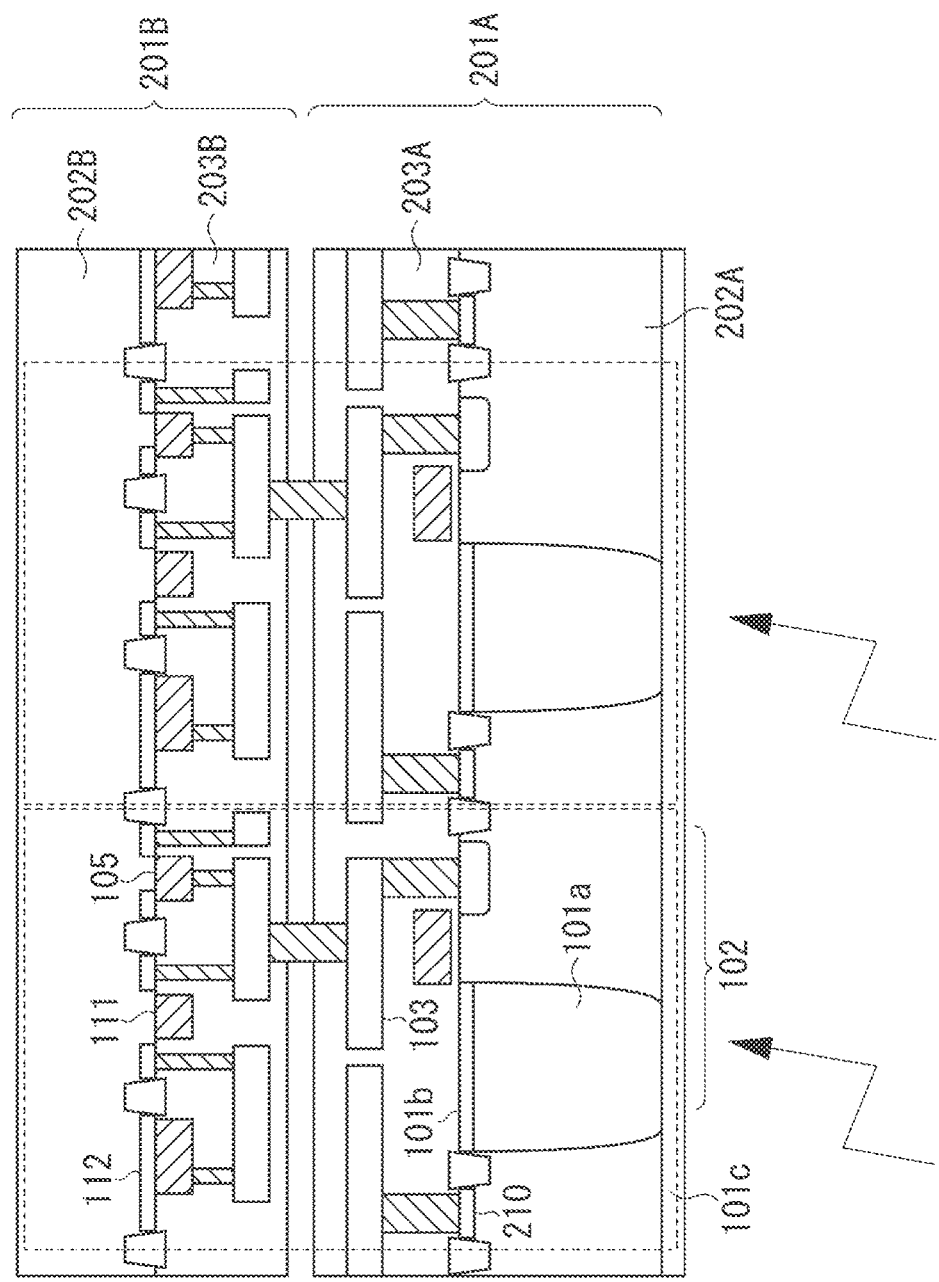

SOLID-STATE IMAGING DEVICE

CROSS-REFERENCE TO RELATED APPLICATION

This application is a Continuation of U.S. application Ser. No. 13/823,057, filed Mar. 13, 2013, which is a National Phase application of International Application PCT/JP2011/005269, filed Sep. 20, 2011, which claims priority from Japanese Patent Application No. Application No. 2010-222590 filed Sep. 30, 2010, which are hereby incorporated by reference herein in their entireties.

TECHNICAL FIELD

The present invention relates to a solid-state imaging device, and, in particular, to a solid-state imaging device including a photoelectric conversion unit and a pixel circuit separately disposed on different substrates.

BACKGROUND ART

There is known a solid-state imaging device including a photoelectric conversion unit and a pixel circuit which are separately disposed on different substrates, and are electrically connected to each other via, for example, a microbump.

Japanese Patent Application Laid-Open No. 2009-170448 discusses a configuration in which an amplifying transistor and a selection transistor constituting a pixel circuit are disposed on a second semiconductor substrate, or only the selection transistor is disposed on the second semiconductor substrate.

In addition, Japanese Patent Application Laid-Open No. 2008-235478 discusses a solid-state imaging device including a first chip and a second chip. A plurality of light receiving pixels of the first chip is arranged on a light receiving surface, and generates electric signals according to incident light. Then, the electric signals of the light receiving pixels are transmitted to the back surface of the light receiving surface via through-wiring. A readout circuit is formed on the second chip. The readout circuit reads out the electric signals via the through-wiring, and outputs them as image signals. In this solid-state imaging device, the first chip and the second chip are disposed in such orientations that the back surface of the first chip and the readout circuit of the second chip face each other, and the terminals of the through-wiring and the readout circuit are electrically connected to each other. Japanese Patent Application Laid-Open No. 2008-235478 further discusses that a global electronic shutter is realized by providing, for example, a memory area for storing signal electric charges to each pixel, and a digital image signal is output by adding an analog/digital (AD) conversion circuit to each pixel.

However, the configuration discussed in Japanese Patent Application Laid-Open No. 2009-170448 is not sufficient to satisfy the functionality of solid-state imaging devices, which has been increasingly diversified in recent years. For example, a pixel additional circuit should be provided to, for example, expand the dynamic range, attain the electronic shutter function, and realize AD conversion at each pixel.

On the other hand, Japanese Patent Application Laid-Open No. 2008-235478 discusses that a pixel additional circuit such as a memory area and an AD conversion circuit is provided to each pixel. Further, Japanese Patent Application Laid-Open No. 2008-235478 discusses that the readout circuit disposed on the second chip is shielded from light.

However, Japanese Patent Application Laid-Open No. 2008-235478 fails to clearly describe the specific details of the light shielding structure. On the contrary, Japanese Patent Application Laid-Open No. 2008-235478 even discusses that it is possible to omit a light shielding layer or reduce the thickness of the light shielding layer since the upper portion of the readout circuit is covered with the first chip. However, the addition of the pixel additional circuit, which enables the expansion of the dynamic range, the attainment of the electronic shutter function, and the realization of AD conversion at each pixel, requires a more secure light shielding structure to be established.

SUMMARY OF INVENTION

The present invention is directed to a solid-state imaging device including a pixel additional circuit provided with an effective light shielding structure.

According to an aspect of the present invention, a solid-state imaging device includes a photoelectric conversion unit, a transfer unit configured to transfer signal electric charges of the photoelectric conversion unit to a floating node, a reset unit configured to set an electric potential of the floating node to a reference electric potential, an amplifying unit configured to amplify a signal generated based on the signal electric charges transferred to the floating node, and a pixel array including a plurality of pixels each including a pixel additional circuit configured to process the signal electric charges transferred to the floating node or the signal amplified by the amplifying unit. In the solid-state imaging device, the photoelectric conversion unit, the transfer unit, and the floating node are disposed on a first substrate, the pixel additional circuit is disposed on a second substrate, and a first light shielding member is disposed on the first substrate. The first light shielding member is configured to reduce light transmitted through the photoelectric conversion unit to enter the pixel additional circuit.

According to an exemplary embodiment of the present invention, it is possible to perform advanced signal processing at each pixel without reducing the area of the photoelectric conversion region.

Further features and aspects of the present invention will become apparent from the following detailed description of exemplary embodiments with reference to the attached drawings.

BRIEF DESCRIPTION OF DRAWINGS

The accompanying drawings, which are incorporated in and constitute a part of the specification, illustrate exemplary embodiments, features, and aspects of the invention and, together with the description, serve to explain the principles of the invention.

FIG. 3 is a cross-sectional view of a solid-state imaging device according to the first exemplary embodiment.

DESCRIPTION OF EMBODIMENTS

Various exemplary embodiments, features, and aspects of the invention will be described in detail below with reference to the drawings.

The present invention relates to a solid-state imaging device including a first substrate with a photoelectric conversion unit disposed thereon and a second substrate with a pixel additional circuit disposed thereon. More specifically, the first substrate is provided with a first light shielding member for reducing light transmitted through the photoelectric conversion unit to enter the pixel additional circuit. The pixel additional circuit is a circuit which applies some signal processing to a signal generated at the photoelectric conversion unit, or a signal amplified from such a signal.

Figure 1:
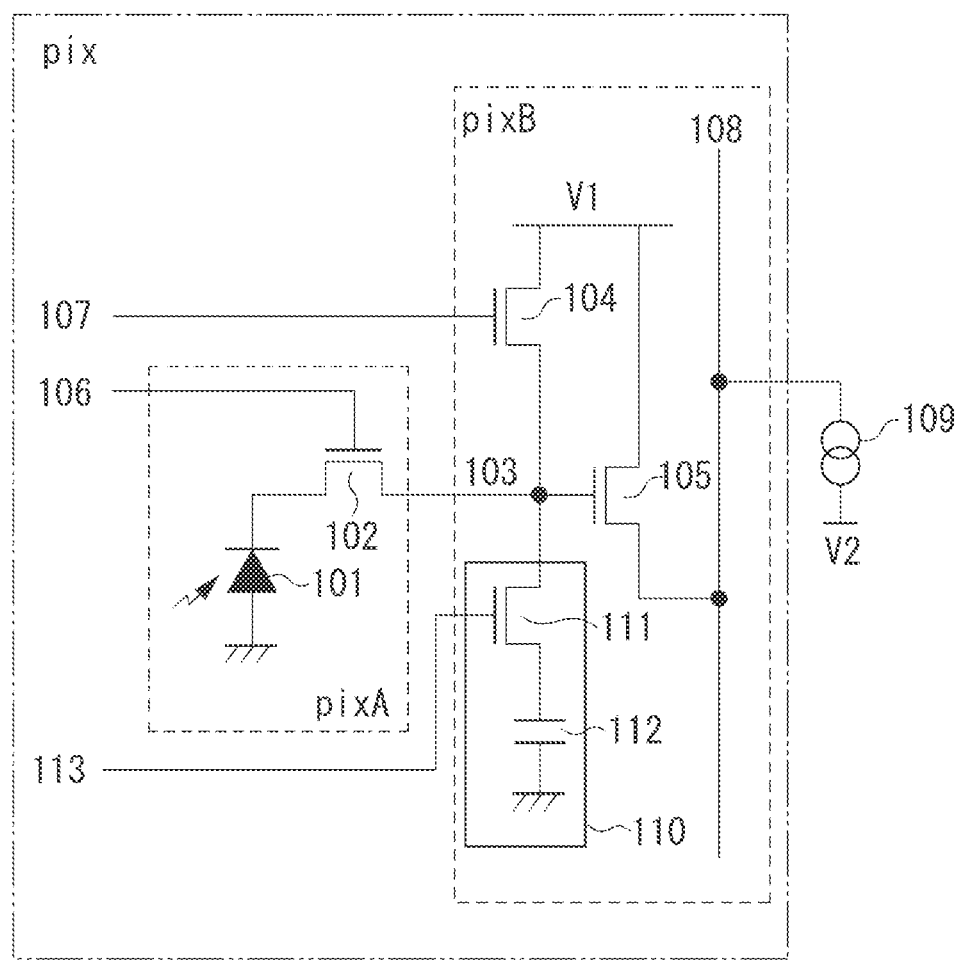
FIG. 1 is an equivalent circuit diagram of a pixel according to a first exemplary embodiment of the present invention.

FIG. 1 is an equivalent circuit diagram of a pixel according to a first exemplary embodiment of the present invention. FIG. 1 illustrates only one pixel, but in practical use, a plurality of pixels is combined to construct a pixel array. The present exemplary embodiment includes a capacitance for switching the sensitivity as the pixel additional circuit.

A photoelectric conversion unit 101 performs photoelectric conversion upon an entry of light, and generates a hole and an electron. The photoelectric conversion unit 101 is embodied by, for example, a photodiode.

A transfer unit 102 transfers the electric charges of the photoelectric conversion unit 101 to a floating node 103, which is a unit for reading out signals. The transfer unit 102 is embodied by, for example, a metal oxide semiconductor (MOS) transistor (transfer MOS transistor).

The floating node 103 is a unit for reading out signals. The floating node 103 includes, for example, a floating diffusion (hereinafter referred to as "FD").

A reset unit 104 sets at least the electric potential of the floating node 103 to a reference electric potential. Further, turning on the reset unit 104 and the transfer unit 102 at the same time may set the electric potential of the photoelectric conversion unit 101 to the reference electric potential. The reset unit 104 is embodied by, for example, an MOS transistor (reset MOS transistor).

An amplifying unit 105 amplifies a signal generated based on one of an electric charge pair generated at the photoelectric conversion unit 101, and outputs the amplified signal. The amplifying circuit 105 is embodied by, for example, an MOS transistor (amplifying MOS transistor). The example illustrated in FIG. 1 is configured such that the gate of the amplifying MOS transistor and the floating node 103 are electrically connected to each other.

A transfer control line 106 is used to control an operation of the transfer unit 102.

A reset control line 107 is used to control an operation of the reset unit 104. If the transfer unit 102 and the reset unit 104 are MOS transistors, the control lines 106 and 107 are wiring for transmitting a pulse for turning on/off the corresponding MOS transistor to the gate of the MOS transistor.

A common output line 108 is a line to which a signal amplified at the amplifying unit 105 is output. Signals from the plurality of pixels included in the pixel array are read out thereto. If the common output line 108 is provided for each pixel row, each common output line 108 can be referred to as a vertical output line, and signals are sequentially read out from a plurality of pixels included in a pixel row.

The configuration of the pixel is connected to a current source 109. The current source 109 supplies bias current to the amplifying unit 105. In the present circuit configuration, the current source 109 supplies bias current for causing the MOS transistor of the amplifying unit 105 to perform a source follower operation.

The configuration of the pixel further includes a pixel additional circuit 110. The pixel additional circuit 110 includes a switch 111 and a capacitance 112. The pixel additional circuit 110 is configured such that one of the nodes of the capacitance 112 is connectable to the floating node 103 via the switch 111. Predetermined voltage, the ground potential in this example, is supplied to the other node of the capacitance 112.

Further, a selection transistor (not illustrated) for controlling selection of a pixel may be provided between the pixel additional circuit 110 and the common output line 108.

Control wiring 113 is used to control the conduction of the switch 111. Voltage V1 is voltage supplied to drains of the MOS transistors respectively constituting the amplifying unit 105 and the reset unit 104. In this example, the voltage V1 is described as common voltage, but may be realized by different power sources by providing separate systems of voltage supply wiring. Voltage V2 is voltage supplied to the current source 109.

Among the elements constituting the pixel, a zone pixA indicates elements disposed on the first substrate, and a zone pixB indicates elements disposed on the second substrate. The pixel pix is constituted by the zones pixA and pixB. More specifically, the photoelectric conversion unit 101, the transfer unit 102, and the FD constituting a part of the floating node 103 are disposed on the first substrate. On the other hand, the pixel additional circuit 110 is disposed on the second substrate. Further, the reset unit 104, the amplifying unit 105, the common output line 108, and the current source 109 are disposed on the second substrate. The FD is electrically connected to the gate of the amplifying MOS transistor and the source of the reset MOS transistor.

The configuration of the pixel has been described concretely in the above paragraphs, but the configuration of the pixel is not limited to the described one. For example, the transistor constituting the amplifying unit 105 may be embodied by a junction gate field-effect transistor (JFET). Further, the pixel may be configured such that a hole is used as signal electric charges. This can be realized by adopting a positive-channel MOS (PMOS) transistor as the transfer MOS transistor. Further, the pixel may be configured such that the amplifying unit 105 and the reset unit 104 are shared by a plurality of photoelectric conversion units 101.

Further, the respective constituent elements of the pixel may be divided to the plurality of substrates in a different manner from the above described arrangement. Besides the above-described arrangement, the reset unit 104 and the amplifying unit 105 may be arranged on the first substrate. However, the pixel additional circuit 110 should be arranged on the second substrate.

Next, a concrete operation of the pixel additional circuit 110 will be described. The following description will be given, assuming that the transfer unit 102, the reset unit 104, and the amplifying unit 105 are embodied by MOS transistors, and electrons are used as signal electric charges.

The photoelectric conversion unit 101, the transfer MOS transistor constituting the transfer unit 102, and the FD are disposed on the first substrate. The reset MOS transistor, the amplifying MOS transistor, and the pixel additional circuit 110 are disposed on the second substrate. Signal electric charges generated at the photoelectric conversion unit 101 are transferred to the floating node 103 by the transfer unit 102. The signal electric charges transferred to the floating node 103 are converted into voltage according to the capacitance of the floating node 103. A change amount V of this voltage is in a relationship expressed by the equation $V=q/C$, in which "C" represents a capacitance value of the floating node, and "q" represents an amount of signal electric charge. Therefore, a reduction in the capacitance value of the floating node 103 leads to an increase in the voltage change amount V and thereby enhancement of the sensitivity. On the other hand, an increase in the capacitance value of the floating node 103 leads to a decline in the sensitivity.

The pixel additional circuit 110 functions to switch this pixel sensitivity. A combination of the switch 111 and the capacitance 112 enables the capacitance value of the floating node 103 to be switched. More specifically, when a high-level pulse is supplied to the control wiring 113 to turn on the switch 111, the capacitance 112 is added to the capacitance of the floating node 103. As a result, the total capacitance value of the floating node 103 is increased, leading to a decline in the pixel sensitivity (low-sensitivity mode). When a low-level pulse is supplied to the control wiring 113 to turn off the switch 111, the capacitance 112 is separated from the floating node 103. As a result, the total capacitance value of the floating node 103 is reduced, leading to enhancement of the pixel sensitivity (high-sensitivity mode). Capturing an image while appropriately switching the sensitivity between the high-sensitivity mode and the low-sensitivity mode enables an expansion of the dynamic range of signals constituting the image. Further, the capacitance 112 may be used as an area where the photoelectric conversion unit 101 holds overflow electric charges after saturation.

Figure 2A:
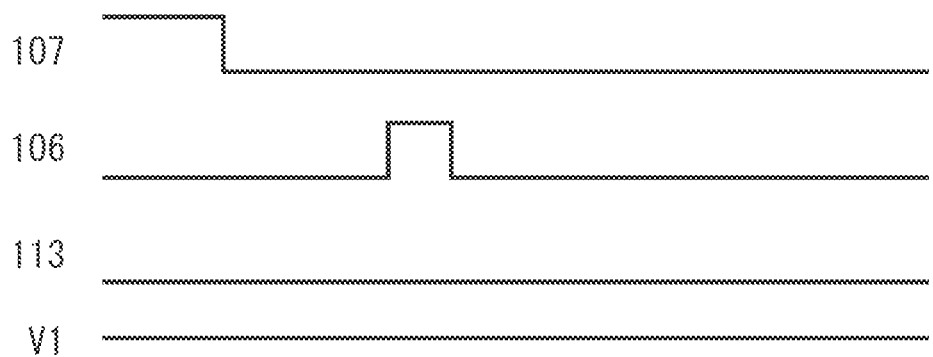
FIG. 2A illustrates an example of a drive pulse supplied to the pixel according to the first exemplary embodiment.
Figure 2B:
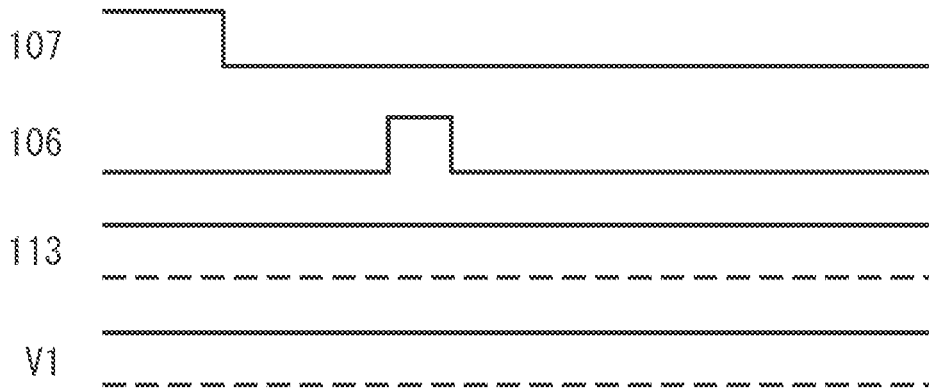
FIG. 2B illustrates an example of a drive pulse supplied to the pixel according to the first exemplary embodiment.

FIGS. 2A and 2B each illustrate an example of a drive pulse supplied to the pixel. In particular, FIG. 2A illustrates a drive pulse of the high-sensitivity mode, and FIG. 2B illustrates a drive pulse of the low-sensitivity mode. At all units and circuits, a supply of a high-level pulse establishes a conduction state, while a supply of a low-level pulse results in a non-conduction state.

A common part shared by the drive sequence of the high-sensitivity mode and the drive sequence of the low-sensitivity mode is as follows. First, the pulse supplied to the reset control line 107 is changed from the high level to the low level. This stops the reset operation of supplying the reference electric potential to the floating node 103.

Then, the pulse supplied to the transfer control line 106 is changed from the low level to the high level, causing the signal electric charges of the photoelectric conversion unit 101 to be transferred to the floating node 103. During these operations, the selected pixel maintains high voltage as the V1, and is in a state capable of outputting a signal to the common output line 108. On the other hand, an unselected pixel has low voltage as the V1.

A difference between the drive sequence of the high-sensitivity mode and the drive sequence of the low-sensitivity mode is the pulse supplied to the control line 113. In the high-sensitive mode, this pulse is maintained at the low level, while in the low-sensitivity mode, this pulse is maintained at the high level. This operation results in such a state that, in the high-sensitivity mode, the capacitance 112 is separated from the floating node 103, while in the low-sensitivity mode, the capacitance 112 is connected to the floating node 103.

FIG. 3 is a schematic cross-sectional view illustrating the electric connection between the elements disposed on the first substrate and the elements disposed on the second substrate. FIG. 3 illustrates a cross section of two pixels for facilitating better understanding of the fact that pixel units are repeatedly arranged.

The cross-sectional view illustrates a first substrate 201A on which the photoelectric conversion unit 101 is disposed, and a second substrate 201B on which the pixel additional circuit is disposed.

The first substrate 201A includes a first semiconductor substrate 202A, and a first insulating film 203A disposed on the first semiconductor substrate 202A. The first insulating film 203A is an interlayer insulating film, and serves to provide insulation between a plurality of wiring layers. The first insulating film 203A may be constructed by laminating a plurality of insulating films.

The second substrate 201B includes a second semiconductor substrate 202B, and a second insulating film 203B disposed on the second semiconductor substrate 202B. The second insulating film 203B is an interlayer insulating film, like the first insulating film 203A. The second insulating film 203B may be constructed by laminating a plurality of insulating films.

The elements in the cross section corresponding to the elements in the equivalent circuit diagram illustrated in FIG. 1 are identified by the same reference numerals as those in FIG. 1, and will not be described in detail.

The first semiconductor substrate 202A includes a negative (N)-type semiconductor region 101a. This region can store an electron which is the signal electric charges. The first semiconductor substrate 202A further includes a first positive (P)-type semiconductor region 101b, and a second P-type semiconductor region 101c. The N-type semiconductor region 101a, the first P-type semiconductor region 101b, and the second P-type semiconductor region 101c constitute the photodiode serving as the photoelectric conversion unit 101. The second P-type semiconductor region 101c also functions as a well which provides a channel of the transfer MOS transistor. The arrows in FIG. 3 indicate incident light. The present exemplary embodiment is a backside-illumination-type solid-state imaging device in which light enters from the surface on the other side of the surface where the first P-type semiconductor region 101b is located, i.e., the surface provided with, for example, the wiring.

A third P-type semiconductor region 210 is used to supply reference voltage to the first and second P-type semiconductor regions 101b and 101c. The reference voltage is supplied to the third P-type semiconductor region 210 via a contact plug and a power supply line. The third P-type semiconductor region 210 has higher impurity concentration than that of the first and second P-type semiconductor regions 101b and 101c. The supplied reference voltage is, for example, the ground potential.

The electric connection between the first substrate 201A and the second substrate 201B is established by electrically connecting conductors disposed on the first and second insulating films 203A and 203B. The electric connection can be established without use of the through-wiring extending through the first and second semiconductor substrates 202A and 202B.

The switch 111 and the capacitance 112 constituting the pixel additional circuit 110 are not disposed on the first substrate 201A where the photoelectric conversion unit 101 is disposed, but are disposed on the second substrate 201B where the photoelectric conversion unit 101 is not disposed. This arrangement enables the photoelectric conversion unit 101 to have a sufficiently large aperture, thereby improving the sensitivity. Further, this arrangement enables the capacitance 112 to occupy a large area, and thereby enables the sensitivity in the low-sensitivity mode to be further reduced. As a result, it becomes possible to output a signal of excellent linearity even in response to an entry of light having a great light amount.

Further, according to the configuration of the present exemplary embodiment, it is possible to improve the light shielding performance of the pixel additional circuit 110. When light is incident on the switch 111 and the capacitance 112, which constitute the pixel additional circuit 110, and the semiconductor region connected to them, this may change the level of a signal held in the capacitance 112. If the pixel additional circuit 110 is disposed on the first substrate 201A, it would be difficult to reduce light incident on the above-described semiconductor region and the like, since the first substrate 201A includes the photoelectric conversion unit 101 disposed thereon. On the contrary, disposing the pixel additional circuit 110 on the second substrate 201B where the photoelectric conversion unit 101 is not disposed enables a sufficient reduction in the light incident onto the above-described semiconductor region and the like. Further, the present exemplary embodiment is configured such that the pixel additional circuit 110 is entirely planarly covered with use of at least a part of a light shielding member disposed on the first substrate 201A. This planar configuration will be concretely described in further detail with reference to FIGS. 4A and 4B to FIGS. 7A and 7B.

Further, in the present exemplary embodiment, the wiring of the first substrate 201A and the wiring of the second substrate 201B are used to shield the switch 111, the capacitance 112, and the semiconductor region connected to them from light. Alternatively, the present exemplary embodiment may further include a member dedicated to light shielding.

Figure 4A:
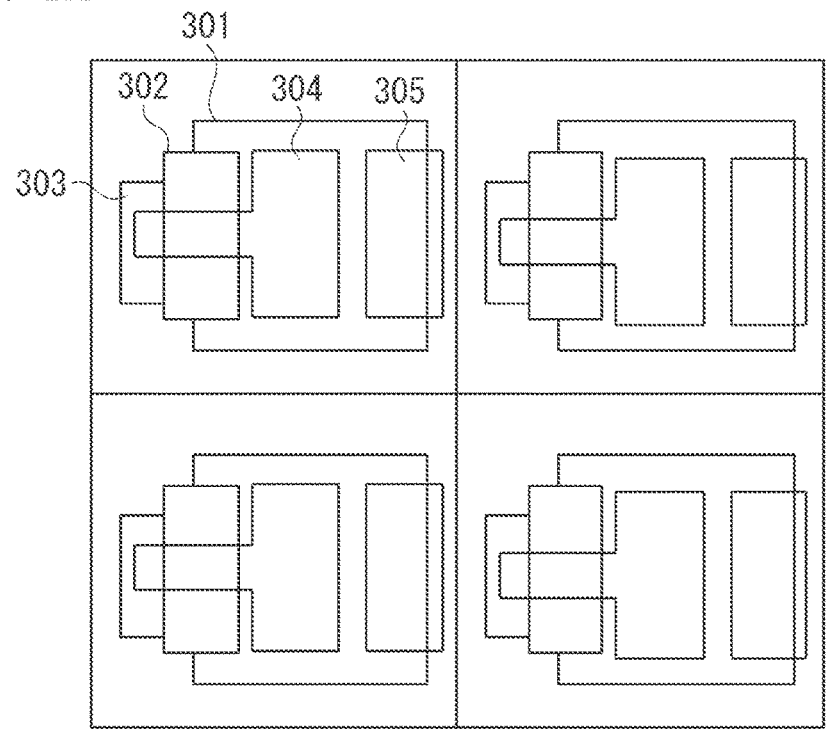
FIG. 4A illustrates a first example of the plan views of the solid-state imaging device according to the first exemplary embodiment.
Figure 4B:
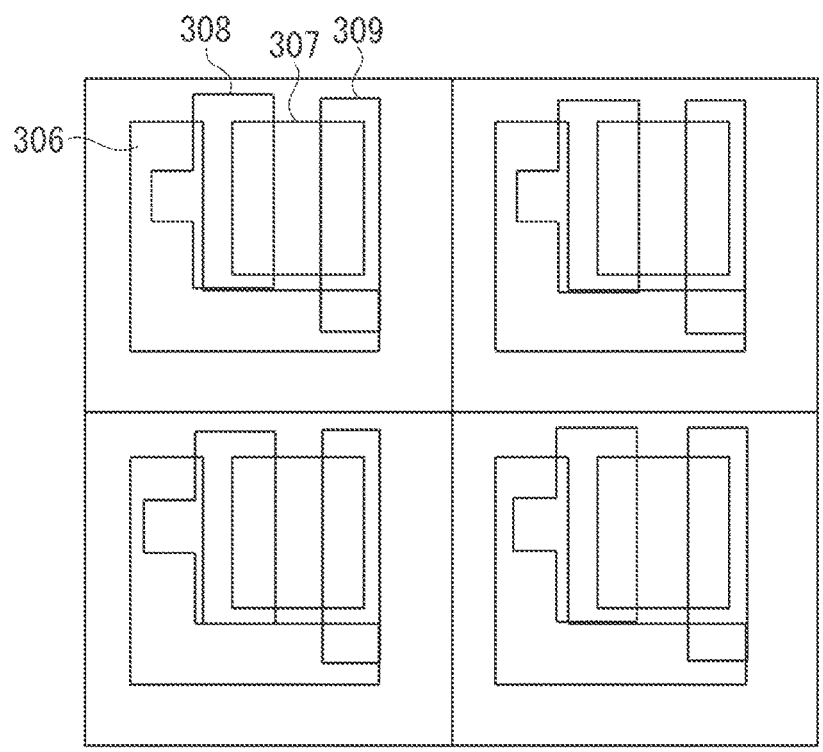
FIG. 4B illustrates the first example of the plan views of the solid-state imaging device according to the first exemplary embodiment.

FIGS. 4A and 4B are plan views corresponding to FIG. 3. Especially, FIGS. 4A and 4B illustrate the extracted portion so as to facilitate better understanding of the positional relationship among the respective circuit elements and the light shielding member related to the present exemplary embodiment. FIG. 4A is a perspective view of the first substrate 201A as viewed from above, and FIG. 4B is a perspective view of the second substrate 201B as viewed from above.

The configuration illustrated in FIGS. 4A and 4B includes a photoelectric conversion unit 301, a transfer gate 302 included in the transfer unit, and an FD 303 included in the floating node. A conduction pattern 304 constitutes the wiring for electrically connecting the FD 303 and the gate of the amplifying MOS transistor of the pixel. A conductor pattern 305 constitutes the wiring for supplying the reference voltage to the third P-type semiconductor region 101c. The configuration illustrated in FIGS. 4A and 4B further includes a pixel circuit arrangement region 306 and a pixel additional circuit arrangement region 307. A conduction pattern 308 constitutes the wiring for connecting the FD 303, the gate of the amplifying MOS transistor, and the source of the reset MOS transistor. A conduction pattern 309 constitutes the wiring for electrically connecting the switch and the capacitance of the pixel additional circuit. The conduction patterns 304 and 305 serve as a first light shielding member disposed on the first substrate 201A. The conduction patterns 308 and 309 serve as a second light shielding member disposed on the second substrate 201B. The first light shielding member and the second light shielding member can reduce an entry of light into at least a part of the pixel additional circuit region 307. In some embodiments, the first light shielding member and the second light shielding member can reduce an entry of light into the entire pixel additional circuit region 307.

Now, the position and the shape of the second light shielding member will be described. In FIGS. 4A and 4B, the regions defined by vertically projecting the first light shielding member to the second substrate side do not cover entirely planarly the pixel additional circuit arrangement region 307. This is because there is a space between the conduction patters 304 and 305. In this case, the second light shielding member may be disposed at a position corresponding to this space so as to be able to effectively block light transmitted through this space.

Figure 5A:
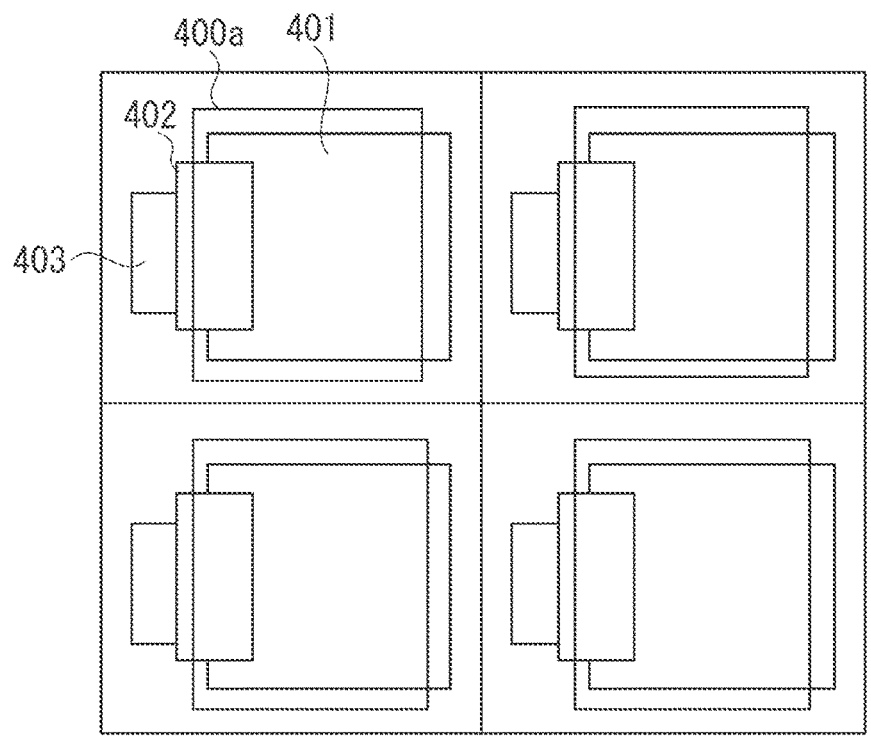
FIG. 5A illustrates a second example of the plan views of the solid-state imaging device according to the first exemplary embodiment.
Figure 5B:
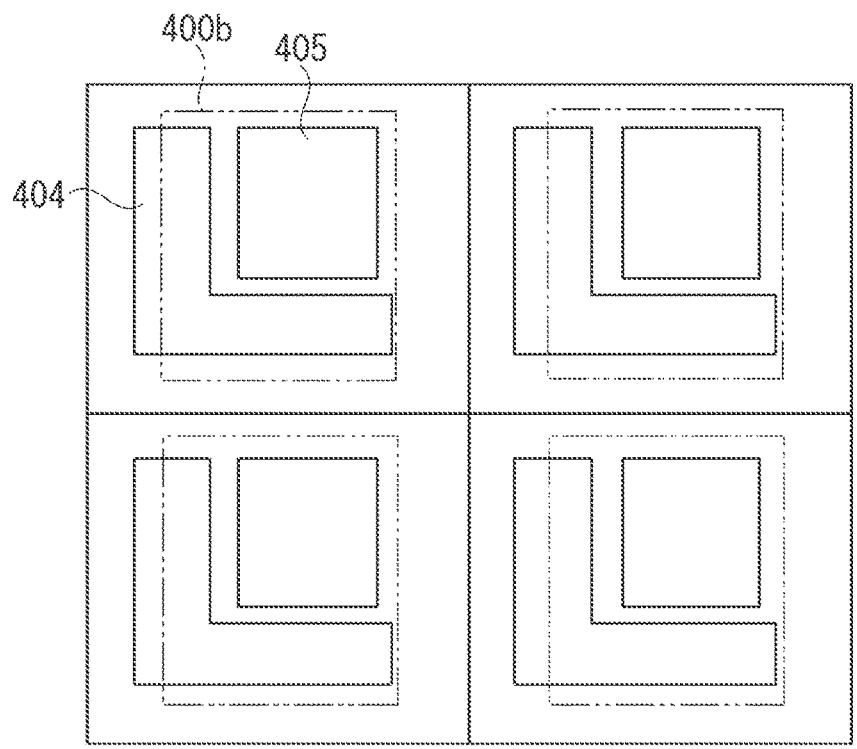
FIG. 5B illustrates the second example of the plan views of the solid-state imaging device according to the first exemplary embodiment.

Other examples of the light shielding member will be described with reference to FIGS. 5A and 5B to FIGS. 7A and 7B. FIGS. 5A and 5B illustrate a second example of the plan views of the solid-state imaging device according to the present exemplary embodiment. FIG. 5A is a perspective view of the first substrate as viewed from above, and FIG. 5B is a perspective view of the second substrate as viewed from above. Although FIGS. 5A and 5B illustrate 2×2 pixels, the solid-state imaging device may include a larger number of pixels.

The configuration illustrated in FIGS. 5A and 5B includes a first light shielding member 400a disposed on the first substrate, and a projection region 400b which is a region defined by vertically projecting the first light shielding member 400a onto the second substrate side. The configuration illustrated in FIGS. 5A and 5B further includes a photoelectric conversion unit 401, a transfer unit 402, and an FD 403 included in the floating node. The configuration illustrated in FIGS. 5A and 5B further includes a pixel circuit arrangement region 404 and a pixel additional circuit arrangement region 405. The second substrate does not have a light shielding member disposed thereon.

The pixel additional circuit arrangement region 405 is located within the projection region 400b defined by vertically projecting the first shielding member 400a onto the second substrate side, and is not located outside the projection region 400b. The first light shielding member 400a planarly covers a part of the photoelectric conversion unit 401, and the projection region 400b thereof covers the entire pixel additional circuit arrangement region 405. Further, the projection region 400b also planarly covers a part of the pixel circuit arrangement region 404.

This arrangement enables light transmitted through the photoelectric conversion unit 401 to be reflected to the photoelectric conversion unit 401, thereby increasing the sensitivity, and at the same time, enables reduction of an entry of light into the pixel additional circuit.

Figure 6A:
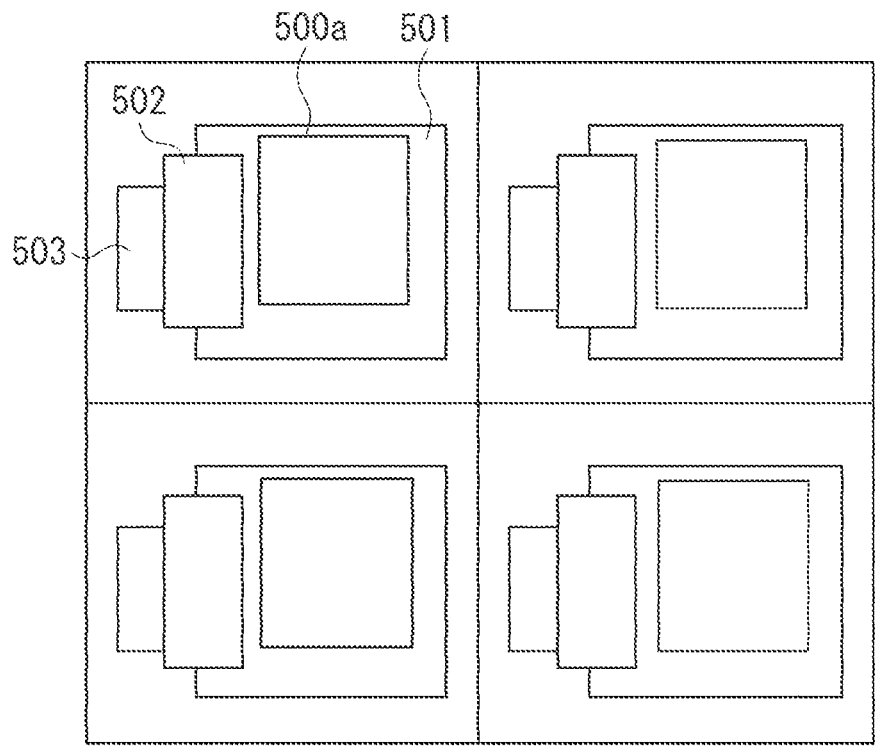
FIG. 6A illustrates a third example of the plan views of the solid-state imaging device according to the first exemplary embodiment.
Figure 6B:
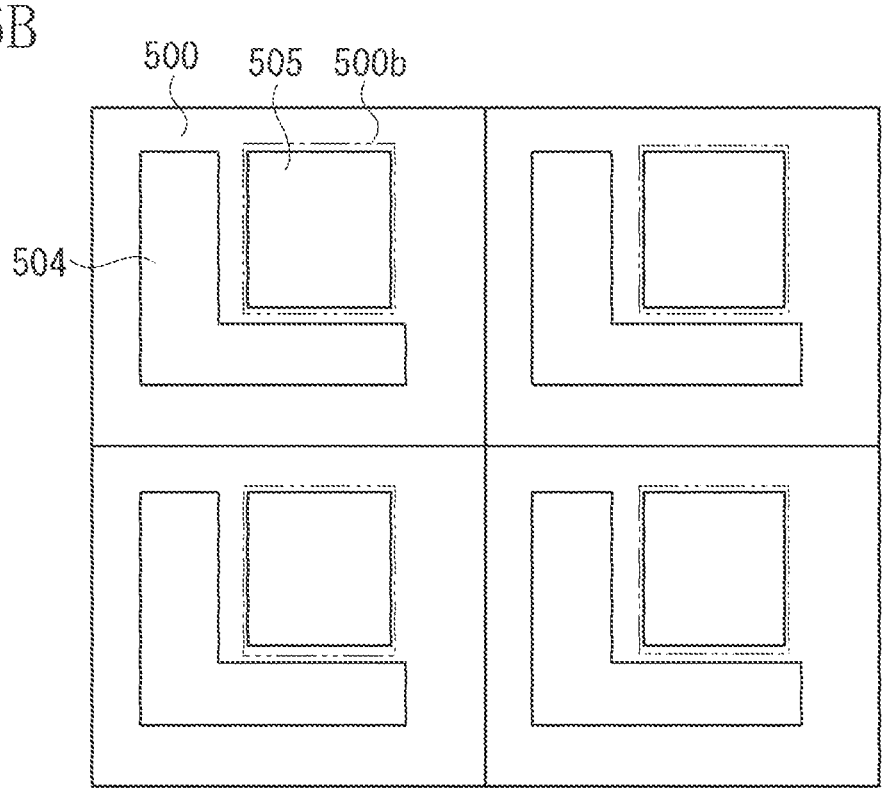
FIG. 6B illustrates the third example of the plan views of the solid-state imaging device according to the first exemplary embodiment.

FIGS. 6A and 6B illustrate a third example of the plan views of the solid-state imaging device according to the present exemplary embodiment. FIG. 6A is a perspective view of the first substrate as viewed from above, and FIG. 6B is a perspective view of the second substrate as viewed from above. A difference from the arrangements illustrated in FIGS. 4A and 4B and FIGS. 5A and 5B is that the projection region of the first light shielding member planarly covers the entire pixel additional circuit, but does not cover the pixel circuit.

The configuration illustrated in FIGS. 6A and 6B includes a first light shielding member 500a disposed on the first substrate, and a projection region 500b defined by vertically projecting the first light shielding member 500a to the second substrate side. This configuration further includes a photoelectric conversion unit 501, a transfer unit 502, an FD 503 included in the floating node, a pixel circuit arrangement region 504, and a pixel additional circuit arrangement region 505.

The pixel additional circuit may be required to have higher light shielding performance than the pixel circuit. Especially, the pixel additional circuit including a capacitance, which occupies a large area, is required to have further higher light shielding performance. In this case, a configuration planarly shielding only the pixel additional circuit, like the present example, is one possible solution. However, since a conduction pattern constituting the wiring of the pixel circuit is disposed on the pixel circuit region, this conduction pattern may have a predetermined light shielding capability to also serve as a light shielding member.

Figure 7A:
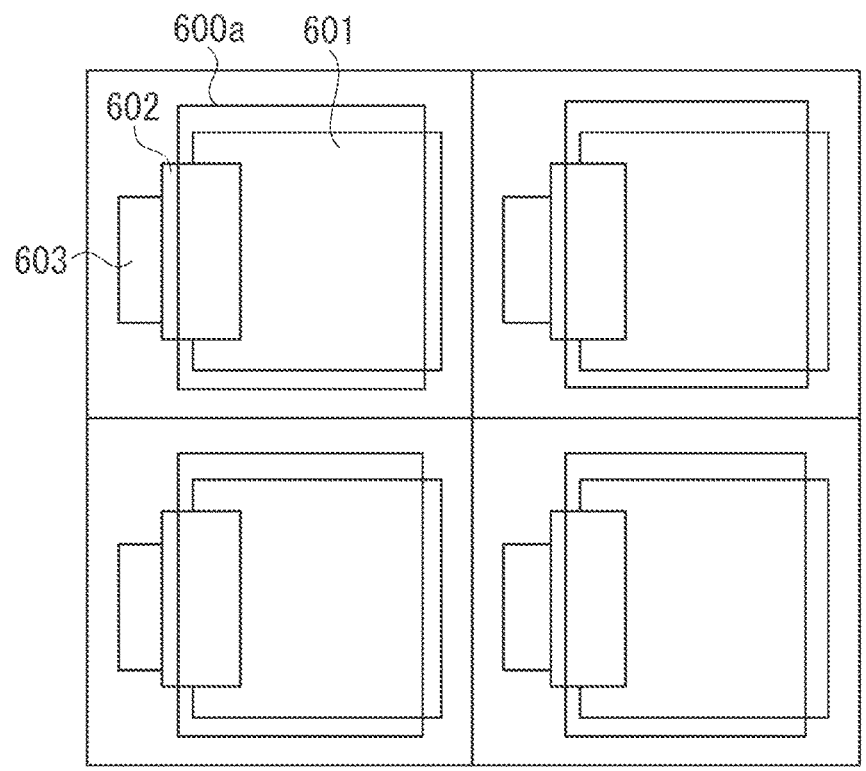
FIG. 7A illustrates a fourth example of the plan views of the solid-state imaging device according to the first exemplary embodiment.
Figure 7B:
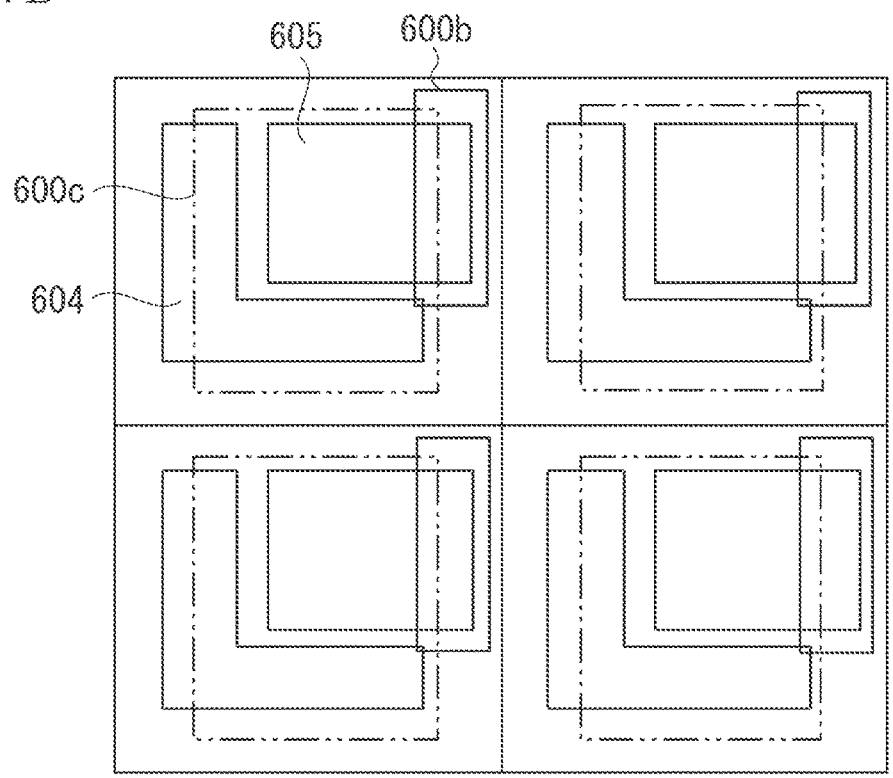
FIG. 7B illustrates the fourth example of the plan views of the solid-state imaging device according to the first exemplary embodiment.

FIGS. 7A and 7B illustrate a fourth example of the plan views of the solid-state imaging device of the present exemplary embodiment. FIG. 7A is a perspective view of the first substrate as viewed from above, and FIG. 7B is a perspective view of the second substrate as viewed from above. Although FIGS. 7A and 7B illustrate 2×2 pixels, the solid-state imaging device may include a larger number of pixels. A difference of the fourth example from the second and third examples is that a second light shielding member is disposed on the second substrate.

The configuration illustrated in FIGS. 7A and 7B includes a photoelectric conversion unit 601, a transfer unit 602, and an FD 603 included in the floating node. This configuration further includes a pixel circuit arrangement region 604 and a pixel additional circuit arrangement region 605.

This configuration further includes a light shielding member 600a disposed on the first substrate, a light shielding member 600b disposed on the second substrate, and a projection region 600c defined by vertically projecting the light shielding member 600a onto the second substrate side. In the present example, the projection region 600c on the second substrate side, which is a projection of the light shielding member 600a disposed on the first substrate, partially planarly covers the pixel additional circuit region 605. The light shielding member 600b disposed on the second substrate covers the remaining part of the pixel additional circuit region 605. In this way, the solid-state imaging device according to the present example is configured such that the entire pixel additional circuit region 605 can be planarly covered by the light shielding member 600b and the projection region 600c.

This configuration can also reduce light to enter the pixel additional circuit region 605.

The light shielding member may be embodied by disposing a member dedicated to light shielding in the same layer as the wiring layer, or by providing wiring that can also serve as a light shielding member.

Especially, according to the fourth example, the pixel additional circuit arrangement region 605 can be shielded from light with use of the light shielding member constituted by a plurality of wiring layers, thereby improving the light shielding performance. Further, if the pixel additional circuit arrangement region 605 is located outside the projection region defined by vertically projecting the photoelectric conversion unit 601 onto the second substrate, like the configuration illustrated in FIGS. 7A and 7B, it is effective to shield the pixel additional circuit arrangement region 605 from light with use of the light shielding member constituted by a plurality of wiring layers.

Next, a first variation of the first exemplary embodiment will be described. In this variation, the pixel additional circuit 110 includes a switch and a capacitance as its constituent elements, as is the case with the above-described first exemplary embodiment. However, this variation is configured such that the pixel additional circuit 110 can be used as a member for the electronic shutter function, especially for the global electronic shutter function. In this case, a pixel to be read out last in a frame will be held in the pixel additional circuit 110 for a long time, and, therefore, high light shielding performance should be provided to the pixel additional circuit 110.

Figure 8A:
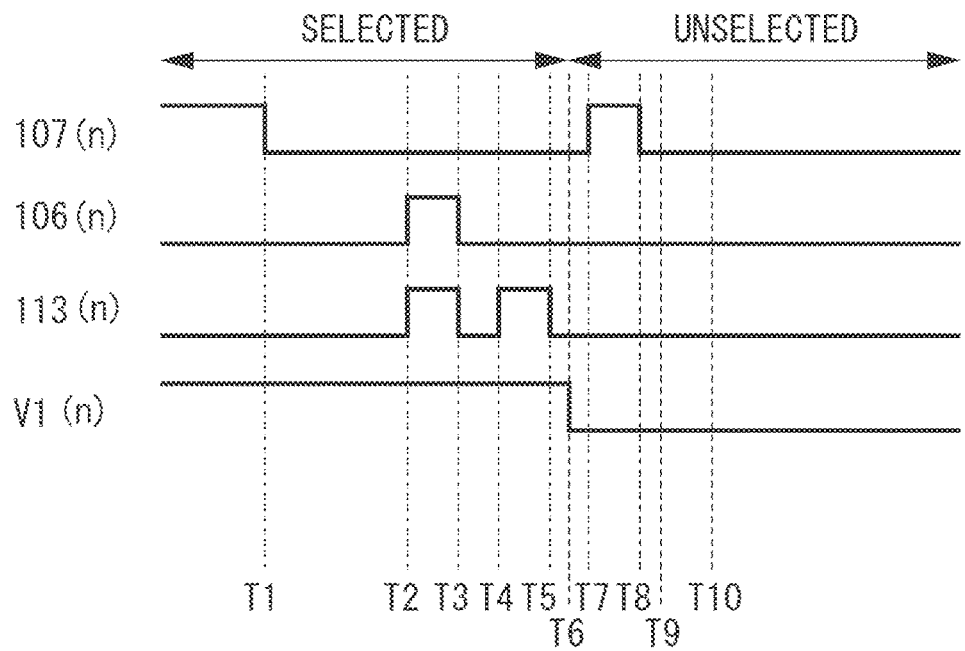
FIG. 8A illustrates an example of a drive pulse according to a first variation of the first exemplary embodiment.
Figure 8B:
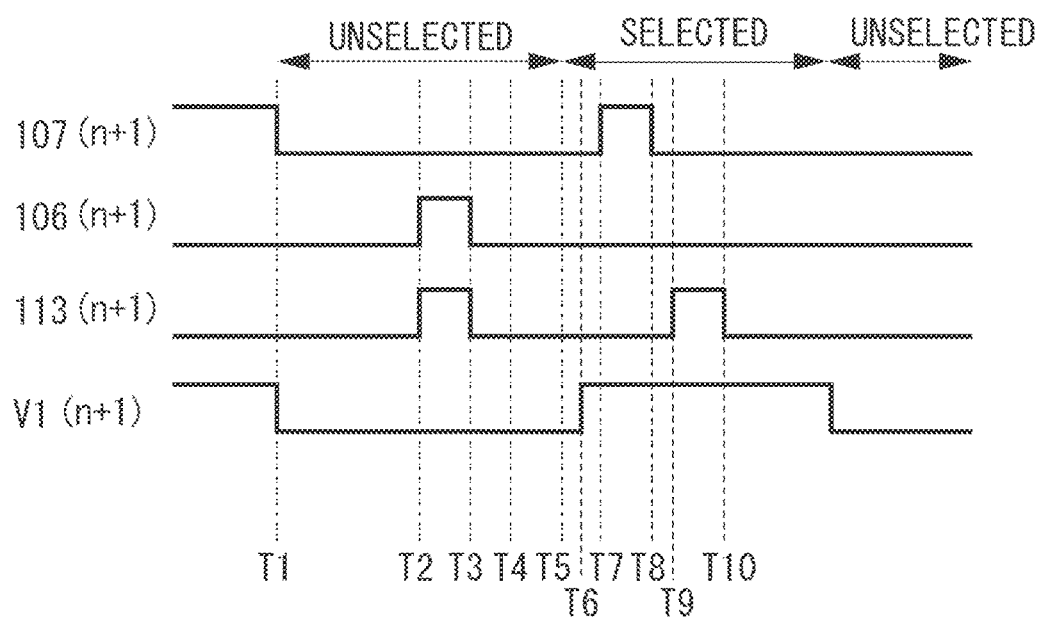
FIG. 8B illustrates an example of a drive pulse according to the first variation of the first exemplary embodiment.

FIGS. 8A and 8B each illustrate an example of a drive pulse according to the present variation. FIG. 8A illustrates a drive pulse supplied to a pixel in an n-th row, and FIG. 8B illustrates a drive pulse supplied to a pixel in an (n+1)-th row.

First, before time T1, the pulses supplied to the reset control lines 107(n) and 107(n+1) are maintained at the high level, and the V1(n) and the V1(n+1) are maintained at the high level. Therefore, the electric potential of the floating nodes 103 is reset to the reference electric potential.

Then, at time T1, the drive pulses supplied to the reset control lines 107(n) and 107(n+1) are changed from the high level to the low level, and the V(n+1) is changed to the low level. As a result, the electric potential of the floating node 103 is set in a floating state, and the drain electric potential of the amplifying MOS transistor of the (n+1)-th row is set in an off state. Therefore, the pixel in the (n+1)-th row is set in an unselected state.

Then, at time T2, the pulses supplied to the transfer control lines 106 and the control lines 113 of the all pixels are collectively changed from the low level to the high level. Subsequently, at time T3, the pulses supplied to the transfer control lines 106 and the control lines 113 of the all pixels are collectively changed from the high level to the low level. As a result, the accumulation periods at the photoelectric conversion units in the all pixels can be terminated at the same time. The transferred signal electric charges are held in the capacitance 112.

Then, at time T4, the pulse supplied to the control line 113 (n) is changed from the low level to the high level. Subsequently, at time T5, the pulse supplied to the control line 113(n) is changed from the high level to the low level. As a result, the signal held in the capacitance 112 of the n-th row is transferred to the floating node 103. Then, the signal of the pixel in the n-th row is read out to the common output line 108 via the amplifying unit 105.

Then, at time T6, the V1(n) is changed from the high level to the low level, and the V1(n+1) is changed from the low level to the high level. As a result, the pixel in the n-th row is set in an unselected state, and the pixel in the (n+1)-th row is set in a selected state.

Then, at time T7, the pulses supplied to the reset control lines 107(n) and 107(n+1) are changed from the low level to the high level. Subsequently, at time T8, the pulses supplied to the reset control lines 107(n) and 107(n+1) are changed from the high level to the low level. As a result, the electric potential of the floating node 103 of the (n+1)-th row is set to the reference electric potential. During the period from time T7 to time T8, the pulse supplied to the reset control line 107 (n) may be maintained at the low level without being changed to the high level. However, it is more effective to change the pulse supplied to the reset control line 107(n) to the high level, since this can ensure that the pixel in the n-th row is in a non-selected state. However, if supply wiring is individually prepared for each of the drain of the amplifying MOS transistor and the drain of the reset MOS transistor, and the drain electric potential of the amplifying MOS transistor is kept constant, a high-level pulse should be supplied to the reset control line 107(n) as mentioned above.

Then, at time T9, the pulse supplied to the control line 113(n+1) is changed from the low level to the high level. Subsequently, at time T10, the pulse supplied to the control line 113(n+1) is changed from the high level to the low level. As a result, the signal held in the capacitance 112 of the pixel in the (n+1)-th row is transferred to the floating node 103. Then, the signal of the pixel in the (n+1)-th row is read out to the common output line 108 via the amplifying unit 105.

This operation allows the pixel additional circuit 110 to be used as a signal holding unit for the electronic shutter function. Further, a control unit may be provided to allow the pixel additional circuit 110 to be switched to perform the sensitivity switching operation or the electronic shutter operation, thereby selectively drive these operations by issuing a control signal.

Next, a second variation of the first exemplary embodiment will be described. The second variation includes a switch and a capacitance as the pixel additional circuit, like the first exemplary embodiment and the first variation thereof. Further, the first variation and the second variation shares such a common feature that the pixel additional circuit functions as the signal holding unit for the electronic shutter function. A difference between the first variation and the second variation is the connection relationship among the circuits.

Figure 9:
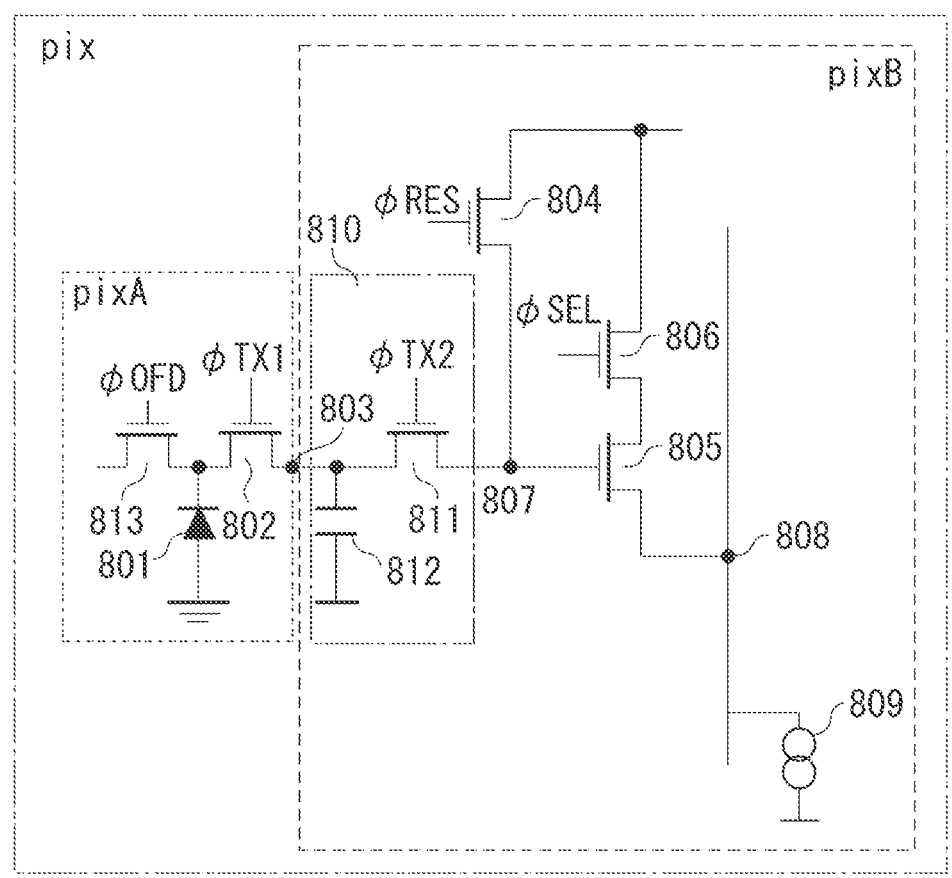
FIG. 9 is an equivalent circuit diagram of a pixel according to a second variation of the first exemplary embodiment.
Figure 10A:
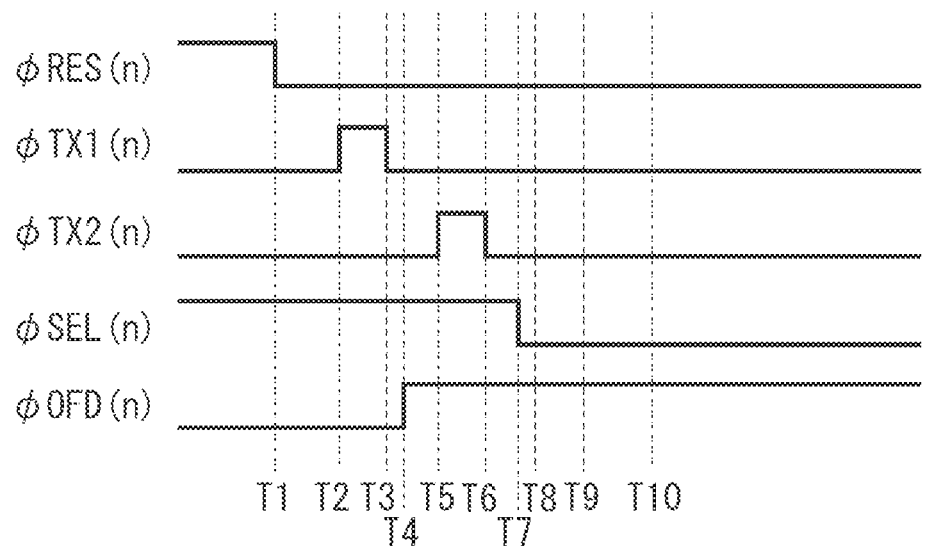
FIG. 10A illustrates an example of a drive pulse according to the second variation of the first exemplary embodiment.
Figure 10B:
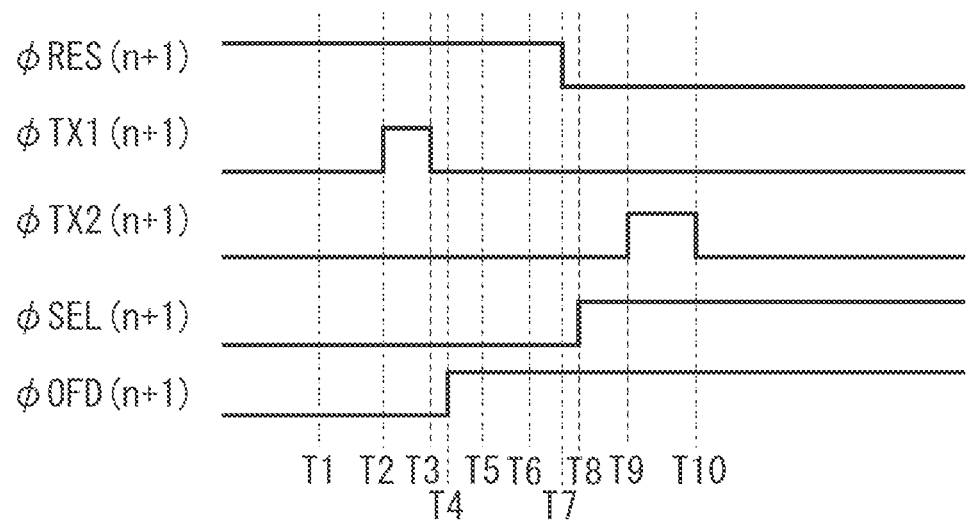
FIG. 10B illustrates an example of a drive pulse according to the second variation of the first exemplary embodiment.

FIG. 9 is an equivalent circuit diagram of two pixels according the second variation. FIGS. 10A and 10B each illustrate an example of a drive pulse according to the second variation.

The second variation includes a photoelectric conversion unit 801. Further, the second variation includes a first transfer unit 802, a first floating node 803, a reset unit 804, an amplifying unit 805, a selection unit 806, and a second floating node 807. Further, the second variation includes a common output line 808, a current source 809, and a pixel additional circuit 810. The pixel additional circuit 810 includes a switch 811 and a capacitance 812. Further, the second variation includes a switch 813 for an overflow drain.

A pulse .phi.TX1 is supplied to a first transfer control line for controlling the conduction of the first transfer unit 802, and a pulse .phi.TX2 is supplied to a second transfer control line for controlling the conduction of a second transfer unit constituted by the switch 811. A pulse .phi.RES is supplied to a reset control line for controlling the conduction of the reset unit 804. A pulse .phi.SEL is supplied to a selection control line for controlling the conduction of the selection unit 806. A pulse .phi.OFD is supplied to an OFD control line for controlling the conduction to the overflow drain.

An operation of the present variation will be described with reference to FIGS. 10A and 10B. FIG. 10A illustrates a pulse of the n-th row, and FIG. 10B illustrates a pulse of the (n+1)-th row. First, at time T1, the pulse .phi.RES of the n-th row is changed from the high level to the low level. This causes the electric potential of the second floating node 807 of the n-th row to be set into a floating state.

Then, at time T2, the pulses .phi.TX1 of the all rows are changed from the low level to the high level. Subsequently, at time T3, the pulses .phi.TX1 of the all rows are changed from the high level to the low level. As a result, the signals of the photoelectric conversion units 801 of the all pixels are transferred to the capacities 812 to be held therein.

Then, at time T4, the pulses .phi.OFD of the all rows are changed from the low level to the high level. This causes the electric charges generated at the photoelectric conversion units 801 after time T4 to be discharged to the overflow drains.

Then, at time T5, the pulse .phi.TX2 of the n-th row is changed from the low level to the high level, and at time T6, the pulse .phi.TX2 of the n-th row is changed from the high level to the low level. As a result, the signal held in the capacitance 812 of the pixel in the n-th row is transferred to the second floating node 807. The second floating node 807 is electrically connected to the gate of the amplifying MOS transistor constituting the amplifying unit 805. The signal transferred to the second floating node 807 is amplified by the amplifying unit 805, and is output to the common output line 808.

Then, at time T7, the pulse .phi.SEL of the n-th row is changed from the high level to the low level. This causes the pixel in the n-th row to be set into a non-selected state. At the same time, the pulse .phi.RES of the (n+1)-th row is changed from the high level to the low level. This causes the electric potential of the second floating node 807 of the pixel in the (n+1)-th row to be set into a floating state.

Then, at time T8, the pulse .phi.SEL of the (n+1)-th row is changed from the low level to the high level. This causes the pixel of the (n+1)-th row to be set into a selected state.

Then, at time T9, the pulse .phi.TX2 of the (n+1)-th row is changed from the low level to the high level, and at time T10, the pulse .phi.TX2 of the (n+1)-th row is changed from the high level to the low level. As a result, the signal held in the capacitance 812 of the pixel in the (n+1)-th row is transferred to the second floating node 807. The second floating node 807 is electrically connected to the gate of the amplifying MOS transistor constituting the amplifying unit 805. The signal transferred to the second floating node 807 is amplified by the amplifying unit 805, and is output to the common output line 808.

As mentioned above, according to the present variation of the first exemplary embodiment, it is possible to perform an electronic shutter operation, or especially, a global electronic shutter operation by providing the pixel additional circuit 810 without reducing the light-receiving area of the photoelectric conversion unit 810. Further, shielding this pixel additional circuit 810 from light with use of the light shielding configuration illustrated in FIGS. 4A and 4B to 7A and 7B can reduce light transmitted through the photoelectric conversion unit to enter the pixel additional circuit.

Figure 11:
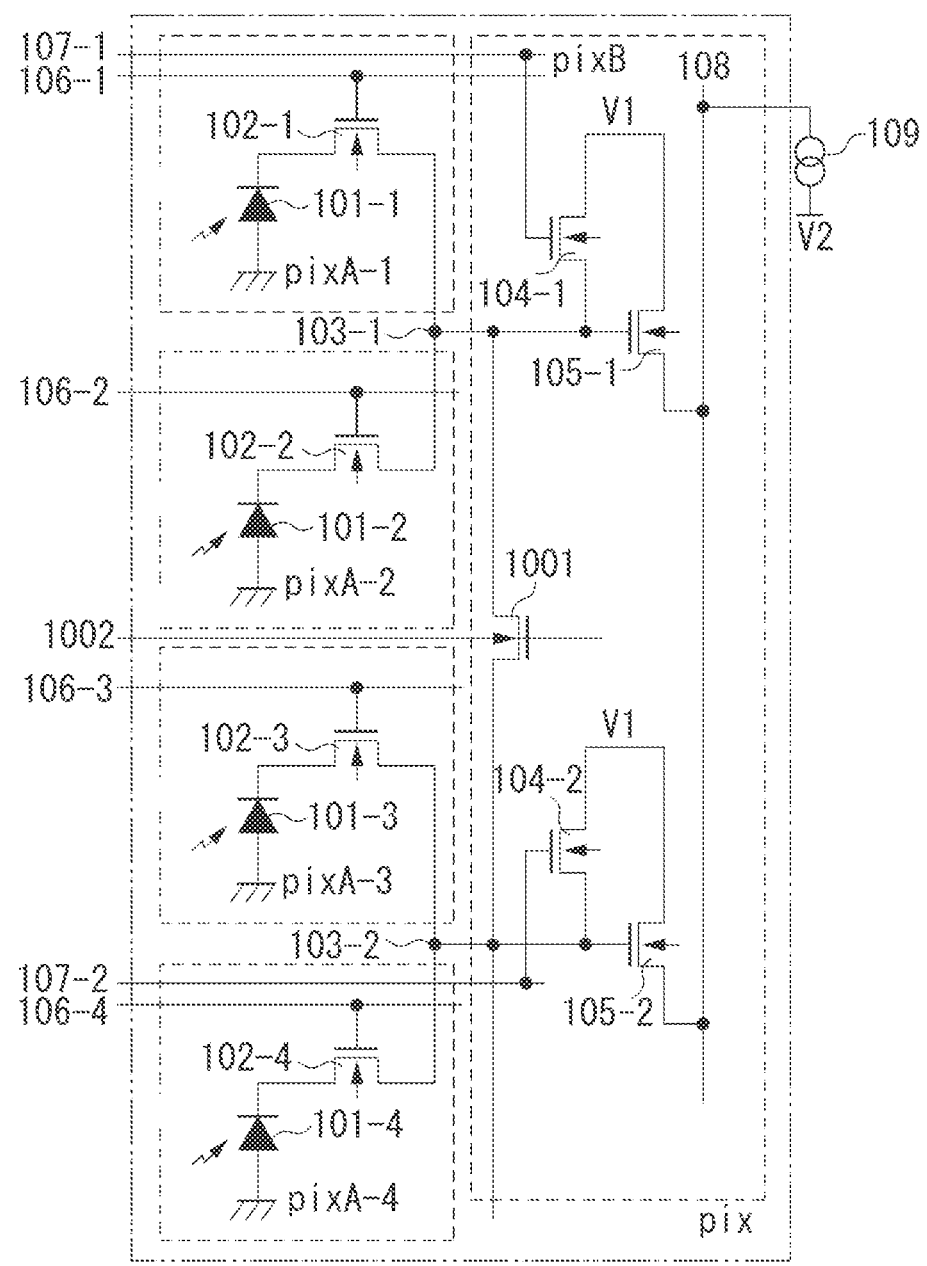
FIG. 11 is an equivalent circuit diagram of a pixel according to a second exemplary embodiment of the present invention.

FIG. 11 is an equivalent circuit diagram of a pixel according to a second exemplary embodiment of the present invention. A difference of the second exemplary embodiment from the first exemplary embodiment is the pixel additional circuit and the wiring connection relationship thereof. In the following description, elements functioning in the same or similar manner as those in the first exemplary embodiment will be identified by the same reference numerals as those in the first exemplary embodiment, and will not be repeatedly described in detail. Suffixes are added to the reference numerals to clearly indicate that those elements are different from plurally disposed other elements having the same functions.

Like the first exemplary embodiment, the zone pixA indicates elements disposed on the first substrate, and the zone pixB indicates elements disposed on the second substrate. The main parts in the cross-sectional configuration according to the present exemplary embodiment are the same as those according to the first exemplary embodiment, and therefore will not be repeatedly described.

The present exemplary embodiment is configured to include a set constituted by two photoelectric conversion units 101 and two transfer units 102 corresponding thereto, and include a common amplifying unit and a common reset unit for one set. FIG. 11 illustrates four pixels, but in practical use, a larger number of pixels may be combined to construct a pixel array.

A pixel additional circuit 1001 is a switch for controlling the electric connections of a floating node 103-1 and a floating node 103-2.

When the pulse supplied to control wiring 1002 is changed to the high level, the pixel additional circuit 1001 is set into an ON state, and the conduction of the floating node 103-1 and the conduction of the floating node 103-2 are established. At this time, for example, the pulses supplied to transfer control lines 106-1 and 106-3 are changed to the high level, causing the transfer units 102-1 and 102-3 to be set into an ON state. This allows the signal electric charges of the photoelectric conversion unit 101-1 and the signal electric charges of the photoelectric conversion unit 101-3 to be respectively added at the floating nodes 103-1 and 103-2.

According to the present exemplary embodiment, the pixel additional circuit 1001 is disposed on the second substrate, and, therefore, it is possible to prevent a reduction in the light-receiving area of the photoelectric conversion units 101. Further, since this pixel additional circuit 1001 is an element electrically connected to the floating nodes 103, an entry of light in this region will affect the resulting image quality. To solve this problem, according to the present exemplary embodiment, the pixel additional circuit 1001 is disposed on the second substrate, and this arrangement can increase the distance that incident light passes through the semiconductor region of the substrate, compared to a solid-state imaging device including the pixel additional circuit disposed on the first substrate. Therefore, it becomes possible to increase the ratio of light absorbed by the semiconductor substrate, thereby improving the light shielding performance. Further, as illustrated in FIGS. 4A and 4B to 7A and 7B, alight shielding member can be additionally provided to reduce light to enter the pixel additional circuit 1001 to thereby improve the resulting image quality.

Further, according to the present exemplary embodiment, the pixel additional circuit 1001 is disposed for each set constituted by a desired number of photoelectric conversion units and transfer units, thereby enabling the number of additions to be arbitrarily changed.

Further, according to the present exemplary embodiment, one amplifying unit and one reset unit are prepared for two photoelectric conversion units and two transfer units to be shared by them. However, the number of photoelectric conversion units and transfer units sharing one amplifying unit and one reset unit is not limited thereto.

As mentioned above, according to the present exemplary embodiment, it is possible to add signals at the floating node 103 while preventing a reduction in the light-receiving area of the photoelectric conversion units 101. Further, it is possible to reduce light to enter the pixel additional circuit 1001, and thereby possible to reduce noises.

Figure 12:
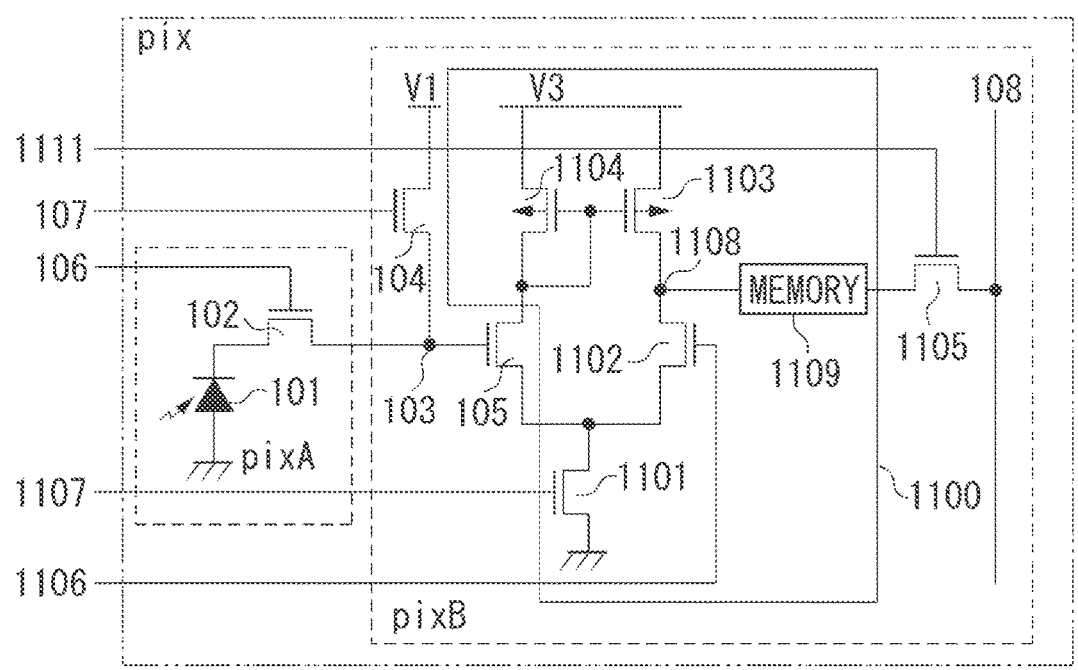
FIG. 12 is an equivalent circuit diagram of a pixel according to a third exemplary embodiment of the present invention.

FIG. 12 is an equivalent circuit diagram of a pixel according to a third exemplary embodiment of the present invention. FIG. 12 illustrates only one pixel, but in practical use, a plurality of pixels is combined to construct a pixel array. A difference of the third exemplary embodiment from the first and second exemplary embodiments is the pixel additional circuit 1101 and the connection relationship thereof. More specifically, the pixel additional circuit 1101 in the present exemplary embodiment functions as an analog/digital (AD) conversion circuit. In the following description, elements functioning in the same or similar manner as those in the first and second exemplary embodiments will be identified by the same reference numerals as those in the first and second exemplary embodiments, and will not be repeatedly described in detail.

The pixel additional circuit 1100 functions as an AD converter. The pixel additional circuit 1100 includes negative-channel metal oxide semiconductor (NMOS) transistors 1101, 1102, and 1105, PMOS transistors 1103 and 1104, and a memory 1109.

A power source V3 supplies power to the sources of the PMOS transistors 1103 and 1104.

The amplifying unit 105, the NMOS transistor 1102, and the PMOS transistors 1103 and 1104 constitute a differential amplification circuit. The differential amplification circuit has an output node 1108. A signal from the output node 1108 is held in the memory 1109.

A switch 1105 is used to output a signal after AD conversion, which is held in the memory 1109, to a bus at the subsequent stage.

Reference signal supply wiring 1106 is used to supply a reference signal to the gate of the PMOS transistor.

Bias wiring 1107 supplies predetermined bias to the gate of the NMOS transistor 1101. This enables the NMOS transistor 1101 to operate as a current source to supply tail current.

Control wiring 1111 is used to control an operation of the switch 1105. This differential amplification circuit 1101 is set to perform a comparator operation, and thereby can provide an AD conversion operation. For example, supplying a ramp voltage signal having a predetermined ramp to the reference signal supply wiring 1106 results in a change in the output level of the output node 1108 of the differential amplification circuit from the high level to the low level. More specifically, the output node 1108 provides a high output when the signal level supplied to the reference signal supply wiring 1106 is lower than the floating node 103, while the output node 1108 provides a low output when the signal level supplied to the reference signal supply wiring 1106 is higher than the floating node 103.

The timing of such a change is counted by a not-illustrated counter, and this counted value is held in the memory 1109, which then realizes AD conversion outputting the counted value as digital data.

Like the previous exemplary embodiments, the present exemplary embodiment includes the pixel additional circuit 1100 disposed on the second substrate, and, therefore, can prevent a reduction in the light-receiving area of the photoelectric conversion unit 101. Further, since the pixel additional circuit 1100 includes the memory 1109, it is apparent that an entry of light to this region will affect the resulting image quality. Such a result is also expected when light enters the pixel additional circuit 1100 electrically connected to the memory 1109. To solve this problem, in the present exemplary embodiment, the pixel additional circuit 1100 including the memory 1109 is disposed on the second substrate, which is effective to secure sufficient light shielding performance. Further, the present exemplary embodiment employs the light shielding configuration as illustrated in FIGS. 4A and 4B to 7A and 7B, which can further enhance the light shielding performance.

The present exemplary embodiment is configured such that the pixel additional circuit 1100, which provides the AD conversion function, includes a comparator. Alternatively, the pixel additional circuit 1100 may be used as an analog differential amplification circuit by a supply of a desired constant signal to the reference signal supply wiring 1106. Further alternatively, the pixel additional circuit 1100 may be configured to be used as, for example, a switched capacitor circuit by an addition of an analog capacitance to the differential amplification circuit. In this case, the light shielding performance can be improved by disposing the analog capacitance on the second substrate.

Having described the present invention in detail and by reference to specific embodiments thereof, it will be apparent that modifications and variants are possible without departing from the technical idea or the main features of the present invention. The above-described exemplary embodiments can be combined in various manners.

More specifically, in the configuration having a common amplification unit shared by a plurality of photoelectric conversion units, the pixel additional circuit may be configured to be used to expand the dynamic range, realize the electronic shutter function, or provide the AD conversion function. According to this configuration, the elements can be more freely arranged on the second substrate. Further, the solid-state imaging device can be configured to reduce 1/f noises by an increase in the gate area of the MOS transistor.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

The invention claimed is:

1. An imaging device comprising:
a first substrate;
a second substrate; and
a plurality of pixels, each including
a photoelectric conversion unit disposed in the first substrate; and
an analog-to-digital converter disposed in the second substrate and configured to convert an analog signal based on a charge generated by the photoelectric conversion unit into a digital signal,
wherein a first light shielding member is disposed between the first substrate and the second substrate, the first light shielding member being configured to reduce light transmitted through the photoelectric conversion unit to enter the analog-to-digital converter.

2. The imaging device according to claim 1,
wherein each of the plurality of pixels includes a transfer unit configured to transfer the charge generated by the photoelectric conversion unit to a floating node,
wherein a transfer transistor is disposed in the first substrate, and
wherein the floating node is electrically connected to the analog-to-digital converter.

3. The imaging device according to claim 1,
wherein the first substrate includes a first semiconductor region, and a first insulating film disposed on the first semiconductor region,
wherein the second substrate includes a second semiconductor region, and a second insulating film disposed on the second semiconductor region, and
wherein an electric connection between the first substrate and the second substrate is established by a connection of conductors disposed on the first and second insulating films.

4. The imaging device according to claim 1,
wherein a second light shielding member is disposed between the first substrate and the second substrate, the second light shielding member being configured to reduce light transmitted through the photoelectric conversion unit to enter the analog-to-digital converter.

5. The imaging device according to claim 4,
wherein a first part of the analog-to-digital converter is located within a first projection region defined by vertically projecting the first light shielding member onto the second substrate,
wherein a second part of the analog-to-digital converter is located outside the first projection region and is located within a second projection region defined by vertically projecting the second light shielding member onto the second substrate.

6. The imaging device according to claim 4,
wherein the second light shielding member is disposed between the first light shielding member and the second substrate.

7. The imaging device according to claim 1,
wherein an entirety of the analog-to-digital converter is located within a projection region defined by vertically projecting the first light shielding member onto the second substrate side.

8. The imaging device according to claim 1, wherein the analog-to-digital converter includes a differential amplification circuit.

9. An imaging device comprising:
a first substrate;
a second substrate; and
a plurality of pixels, each including
a photoelectric conversion unit disposed in the first substrate; and
an analog-to-digital converter disposed in the second substrate and configured to convert an analog signal based on a charge generated by the photoelectric conversion unit into a digital signal,
wherein a wiring is disposed between the first substrate and the second substrate, and
wherein at least part of the analog-to-digital converter is located within a projection region defined by vertically projecting the wiring onto the second substrate side.

10. The imaging device according to claim 9, wherein each of the plurality of pixels includes:

a floating diffusion region disposed in the first substrate and connected to the analog-to-digital converter; and a transfer unit configured to transfer the charge generated by the photoelectric conversion unit to the floating diffusion region.

11. The imaging device according to claim 10, wherein the plurality of pixels includes at least a first pixel and a second pixel adjacent to the first pixel, wherein the first substrate includes a first isolation portion, and wherein the photoelectric conversion unit and the floating diffusion region of the first pixel are isolated from the photoelectric conversion unit and the floating diffusion region of the second pixel by the first isolation portion.

12. The imaging device according to claim 11, wherein each of the plurality of pixels includes a transistor disposed in the second substrate.

13. The imaging device according to claim 12, wherein the second substrate includes a second isolation portion, and wherein the transistor of the first pixel are isolated from the transistor of the second pixel by the second isolation portion.

14. The imaging device according to claim 13, wherein the analog-to-digital converter of the first pixel are isolated from the analog-to-digital converter of the second pixel by the second isolation portion.

15. The imaging device according to claim 14, wherein the transfer unit includes a transfer gate electrode disposed between the first substrate and the wiring.

16. The imaging device according to claim 15, wherein the transistor includes a gate electrode disposed between the second substrate and the wiring.

17. The imaging device according to claim 16, wherein the wiring is formed of a metal.

18. The imaging device according to claim 17, wherein the wiring is connected to at least one selected from a group that consists of the floating diffusion region, the transfer gate electrode, the transistor and the analog-to-digital converter.

19. The imaging device according to claim 18, wherein the transistor is configured to reset a voltage of the floating diffusion region.

20. The imaging device according to claim 18, wherein the transistor forms the analog-to-digital converter.

21. The imaging device according to claim 20, wherein the analog-to-digital converter includes a differential amplification circuit.

22. The imaging device according to claim 17, wherein the wiring is configured to provide a reference voltage for the plurality of pixels.

23. The imaging device according to claim 22, wherein the analog-to-digital converter includes a differential amplification circuit.

24. The imaging device according to claim 17, wherein each of the plurality of pixels includes a switch configured to switch a capacitance of the floating diffusion region.

25. The imaging device according to claim 24, wherein the wiring is connected to the switch.

* * * * *